United States Patent
Cho et al.

(10) Patent No.: US 10,686,379 B2
(45) Date of Patent: Jun. 16, 2020

(54) LOAD CURRENT FEEDFORWARD SCHEMES FOR CURRENT-MODE CONTROLLED POWER CONVERTERS

(71) Applicant: Linear Technology Holding, LLC, Norwood, MA (US)

(72) Inventors: Yonghwan Cho, San Jose, CA (US); Keith Szolusha, Saratoga, CA (US); Min Chen, Fremont, CA (US)

(73) Assignee: Linear Technology Holding, LLC, Norwood, MA (US)

( * ) Notice: Subject to any disclaimer, the term of this patent is extended or adjusted under 35 U.S.C. 154(b) by 0 days.

(21) Appl. No.: 16/127,876

(22) Filed: Sep. 11, 2018

(65) Prior Publication Data

US 2019/0245442 A1 Aug. 8, 2019

Related U.S. Application Data

(60) Provisional application No. 62/627,051, filed on Feb. 6, 2018.

(51) Int. Cl.
*G05F 1/10* (2006.01)
*H02M 3/158* (2006.01)
(Continued)

(52) U.S. Cl.
CPC .......... *H02M 3/1582* (2013.01); *G05F 1/565* (2013.01); *H02M 1/08* (2013.01); *H02M 3/156* (2013.01);
(Continued)

(58) Field of Classification Search
CPC ................ H02M 1/4208; H02M 1/08; H02M 2001/009; H02M 3/1582; G03F 1/61
(Continued)

(56) References Cited

U.S. PATENT DOCUMENTS 3,546,564 A * 12/1970 Denny .................... G05F 1/561
323/280
5,461,303 A * 10/1995 Leman ................ H02M 1/4225
323/209
(Continued)

FOREIGN PATENT DOCUMENTS

EP    3426009 A1    1/2019

OTHER PUBLICATIONS

"LT8390: 60V Synchronous 4-Switch Buck-Boost Controller with Spread Spectrum", Linear Technology Datasheet, (2016), 32 pgs.
(Continued)

*Primary Examiner* — Rajnikant B Patel
(74) *Attorney, Agent, or Firm* — Schwegman Lundberg & Woessner, P.A.

(57) ABSTRACT

A switching power converter circuit comprises an inductor arranged to receive input energy from an input circuit node; a switch circuit coupled to the inductor; a load current sensing circuit element coupled to a regulated circuit node and an output circuit node; a compensation circuit coupled to a compensation circuit node; a control circuit coupled to the compensation circuit node and the switch circuit, the control circuit configured to modulate activation of the switch circuit to regulate a voltage at the regulated circuit node; and a feedforward circuit coupled to the load current sensing circuit element and the compensation circuit, and configured to adjust modulation of the switch circuit according to sensed load current.

24 Claims, 7 Drawing Sheets

(51) Int. Cl.
*H02M 1/08* (2006.01)
*G05F 1/565* (2006.01)
*H02M 3/156* (2006.01)
*H02M 1/00* (2006.01)
*H02M 3/155* (2006.01)

(52) U.S. Cl.
CPC ............ *H02M 2001/0009* (2013.01); *H02M 2001/0019* (2013.01); *H02M 2001/0025* (2013.01); *H02M 2003/1557* (2013.01)

(58) Field of Classification Search
USPC ........ 323/222, 212, 271, 282–290, 224, 351
See application file for complete search history.

(56) References Cited

U.S. PATENT DOCUMENTS

| | | | | |
|---|---|---|---|---|
| 6,737,841 B2* | 5/2004 | Wrathall | ............ | H02M 3/156 323/282 |
| 7,352,162 B1* | 4/2008 | Chang | ............ | H02M 1/36 323/284 |
| 7,671,575 B1 | 3/2010 | Suzuki et al. | | |
| 8,174,250 B2* | 5/2012 | Wu | ............ | H02M 3/156 323/271 |
| 8,704,500 B2* | 4/2014 | Xiao | ............ | H02M 3/1584 323/272 |
| 9,172,302 B2* | 10/2015 | Nakamura | ............ | H02M 3/156 |
| 9,467,051 B2* | 10/2016 | Stoichita | ............ | H02M 3/158 |
| 10,063,143 B1* | 8/2018 | Fan | ............ | H02M 3/158 |
| 10,454,369 B2* | 10/2019 | Savic | ............ | H02M 3/156 |
| 2002/0135345 A1* | 9/2002 | Terashi | ............ | H02M 3/156 323/283 |
| 2004/0076026 A1 | 4/2004 | Dinh et al. | | |
| 2005/0017703 A1* | 1/2005 | Walters | ............ | H02M 3/156 323/288 |
| 2005/0194952 A1 | 9/2005 | Carpenter et al. | | |
| 2006/0043942 A1* | 3/2006 | Cohen | ............ | H02M 3/156 323/207 |
| 2006/0232226 A1* | 10/2006 | Ortiz | ............ | H02M 1/4225 315/291 |
| 2007/0085523 A1* | 4/2007 | Scoones | ............ | H02M 3/158 323/314 |
| 2008/0180075 A1* | 7/2008 | Xie | ............ | H02M 3/156 323/282 |
| 2009/0146634 A1 | 6/2009 | Audy | | |
| 2011/0029162 A1 | 2/2011 | Ishihara et al. | | |
| 2011/0291623 A1 | 12/2011 | Granat | | |
| 2013/0148396 A1* | 6/2013 | Walters | ............ | H02M 1/4225 363/126 |
| 2014/0152285 A1 | 6/2014 | Rozek | | |
| 2014/0292293 A1 | 10/2014 | Feckl et al. | | |
| 2014/0292300 A1 | 10/2014 | Yan et al. | | |
| 2017/0090494 A1 | 3/2017 | Cui et al. | | |
| 2017/0098999 A1* | 4/2017 | Calhoun | ............ | H02M 1/088 |
| 2017/0279355 A1 | 9/2017 | Kudva et al. | | |
| 2019/0027103 A1 | 1/2019 | Zhang | | |

OTHER PUBLICATIONS

"European Application Serial No. 19154067.3, Extended European Search Report dated Jul. 16, 2019", 8 pgs.
"European Application Serial No. 19154067.3, Communication Pursuant to Article 94(3) EPC dated Mar. 9, 2020", 5 pgs.

* cited by examiner

LOAD CURRENT FEEDFORWARD SCHEMES FOR CURRENT-MODE CONTROLLED POWER CONVERTERS

FIELD OF THE DISCLOSURE

This document relates to integrated circuits and in particular to power converter circuits that provide a regulated voltage from an input voltage.

BACKGROUND

Electronic systems can include devices that require a regulated power source. Power converter circuits can be used to provide a regulated voltage to a load. A large step change in current at the load of a power converter circuit may cause the regulated output voltage to exceed the desired regulation range. This may negatively affect the operation of the load device.

SUMMARY OF THE DISCLOSURE

This document relates generally to switching power converters and methods of their operation. In some aspects, a switching power converter circuit includes an inductor arranged in the circuit to receive input energy from an input circuit node; a switch circuit coupled to the inductor, a load current sensing circuit element coupled to a regulated circuit node and an output circuit node, a compensation circuit coupled to a compensation circuit node, a control circuit coupled to the compensation circuit node and the switch circuit (the control circuit configured to modulate activation of the switch circuit to regulate a voltage at the regulated circuit node), and a feedforward circuit coupled to the load current sensing circuit element and the compensation circuit and configured to adjust modulation of the switch circuit according to sensed load current.

In some aspects, a method of operating a power converter circuit includes charging an inductor using energy provided at an input circuit node of the power converter circuit, modulating the charging of the inductor to regulate a voltage of a regulated circuit node of the switching power converter circuit using a control circuit loop coupled to the regulated circuit node, filtering the control loop using a compensation circuit coupled to a compensation circuit node of the switching power converter circuit, sensing a load current provided to an output circuit node, and adjusting the modulating of the charging of the inductor by adjusting a voltage of the compensation circuit node according to sensed load current.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Power converter circuits may be used to provide a regulated voltage output for an electronic system. Some power converter circuits are switching power converter circuits that convert the input voltage to the regulated output voltage. The regulated voltage conversion can provide a regulated output voltage that is higher than the input voltage of the regulator, lower than the input voltage, or inverted from the input voltage. The regulation is typically achieved by recurrently charging an inductor from an energy source and then discharging the energy of the inductor to drive a load. The charging and discharging can be accomplished using electronic switches that include transistors.

A challenge in control of power converters is to provide a regulated output voltage regardless of the change in the load current. When the load current has a step change with high slew rate and large amplitude, the output voltage might be out of the desired regulation range, which could negatively affect the operation of the load device. One possible solution is to increase the output capacitance. However, it is desired for most of applications to have minimized capacitance at the output for higher efficiency, and lower volume and cost. Another approach is to increase the bandwidth of the controller of the power converter circuit so that the output voltage is regulated in the desired range with minimized output capacitance.

Power converters can include an inductor. Energy is switched onto the inductor and energy of the inductor is used to provide the regulated voltage. Current-mode controlled power converters control the inductor current directly. This type of power converter can provide robustness against overcurrent failure of the switch transistor and relatively simple compensation can provide large phase and gain margins of the output voltage control loop. The devices and methods described herein include a control scheme that increases the bandwidth of the output voltage control loop by taking advantage of the control structure of the current-mode controlled power converters.

Figure 1A:
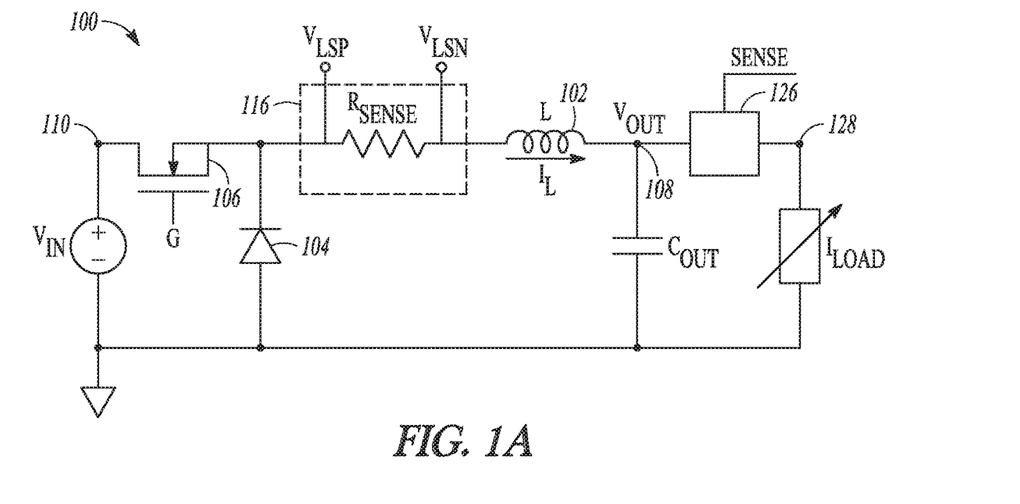
FIGS. 1A and 1B are circuit diagrams of a switching power converter circuit in an aspect.
Figure 1B:
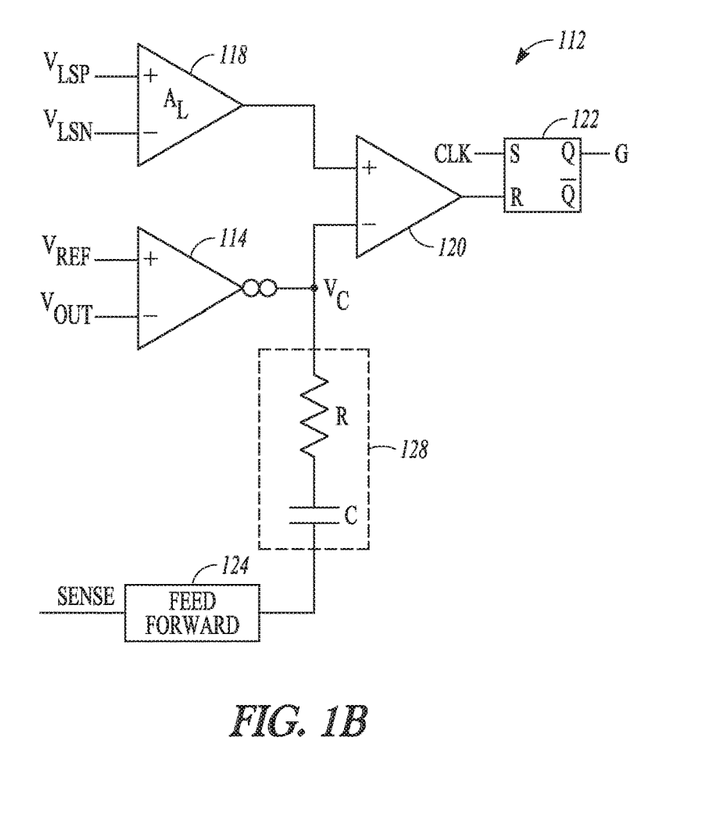

FIGS. 1A and 1B are circuit diagrams of a switching power converter circuit 100 in an aspect. In FIG. 1A the circuit includes an inductor 102, a diode 104, and a switch circuit 106. The inductor 102 receives input energy from the input circuit node 110 when the switch circuit 106 is activated. The circuit topology of the switching power converter circuit 100 is a buck converter with the switch circuit 106 arranged between the input circuit node 110 and the inductor 102, the inductor coupled to the regulated circuit node 108, and the diode coupled from the switch circuit to the circuit ground node. The buck converter regulates the voltage of the regulated circuit node to a voltage less than the value of the input voltage Vin.

FIG. 1B shows a control circuit 112 for the switching power converter circuit 100. The control circuit 112 modulates activation of the switch circuit (e.g., using pulse width modulation or PWM) to regulate the voltage of the regulated circuit node 108. In the example of FIG. 1B, the control circuit 112 implements a feedback control loop to regulate the voltage of the regulated circuit node. The control circuit 112 includes an error amplifier 114 that produces a current proportional to a difference between a reference voltage (Vref) and the voltage at the regulated circuit node (Vout). Depending on the value of Vref, the regulated voltage Vout may be scaled (e.g., scaled to a smaller voltage value) for the comparison to Vref. The output of the error amplifier 114 is provided to one input of a comparator 120 of the control circuit 112.

The switching power converter circuit 100 includes an inductor current sensing circuit element 116 coupled in series with the inductor 102. The inductor current sensing element may also be positioned in series with the switch circuit 106, or in series with the diode 104. In the example of FIG. 1A, the inductor current sensing circuit element 116 can be a resistive circuit element (e.g., resistor $R_{SENSE}$) and the voltage across the resistive circuit element is provided to inputs of voltage amplifier 118 having amplifier gain $A_L$. The output of the voltage amplifier 118 is provided to the other input of comparator 120. The output of the comparator 120 is provided to a flip-flop circuit 122. The flip-flop circuit 122 is coupled to the switch circuit 106 so that the output of comparator is used to modulate activation of the switch circuit 106. Thus, the switching power converter circuit is controlled using the inductor current $I_L$ and the difference in Vout from Vref.

To increase the bandwidth of the controller circuit 112 to improve the transient response of the switching power converter circuit, the load current ($I_{LOAD}$) is fed forward to the controller circuit. In this way, the input energy to the inductor can be adjusted immediately at the same rate that the load current is changing. Thus, the output voltage is regulated without significant deviation even when the slew rate of the load current is high.

The control circuit 112 includes a feedforward circuit 124 and the switching power converter circuit includes a load current sensing circuit element 126. The feedforward circuit 124 adjusts the modulation of the switch circuit 106 according to sensed load current. The control circuit 112 includes a compensation circuit 128 coupled to a compensation circuit node $V_C$. The compensation circuit 128 provides filtering to the output of the error amplifier 114. In the example of FIG. 1B, the compensation circuit 128 includes an RC circuit that is connected to the output of the feedforward circuit 124. The feedforward circuit 124 adjusts the voltage at the compensation circuit, and therefore the input of the comparator 120, to adjust the modulation of the switch circuit 106. Thus, the changing of the inductor current in response to changes at the load is improved.

For example, the output voltage of the switching power converter circuit is kept constant when the average inductor current $I_L$ is equal to the average load current. If there is a step change in current at the load, it takes only 2 or 3 PWM cycles for the inductor current to follow the load current when the load current $I_{LOAD}$ is fed forward to the control circuit 112 as in FIGS. 1A and 1B. The actual number of PWM cycles needed to respond depends on the input voltage Vin and the inductance L.

Figure 2A:
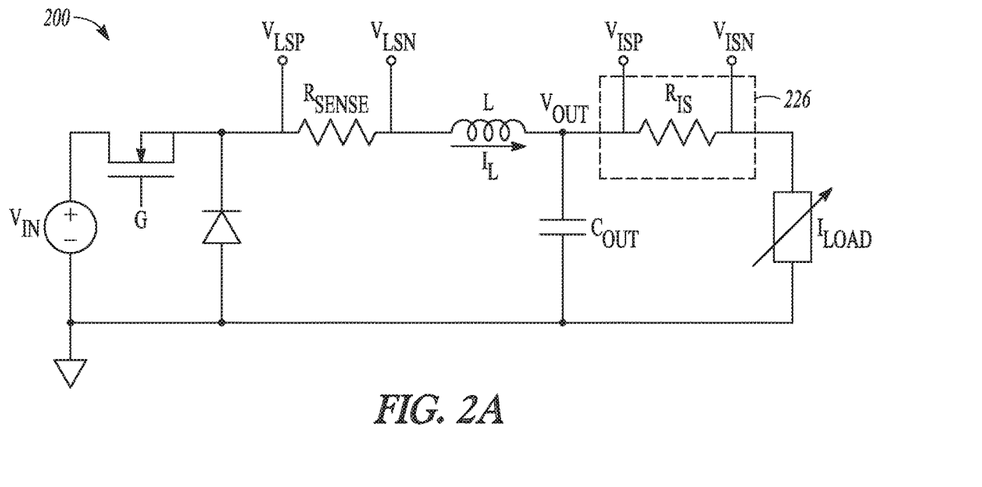
FIGS. 2A and 2B are circuit diagrams of a switching power converter circuit in another aspect.
Figure 2B:
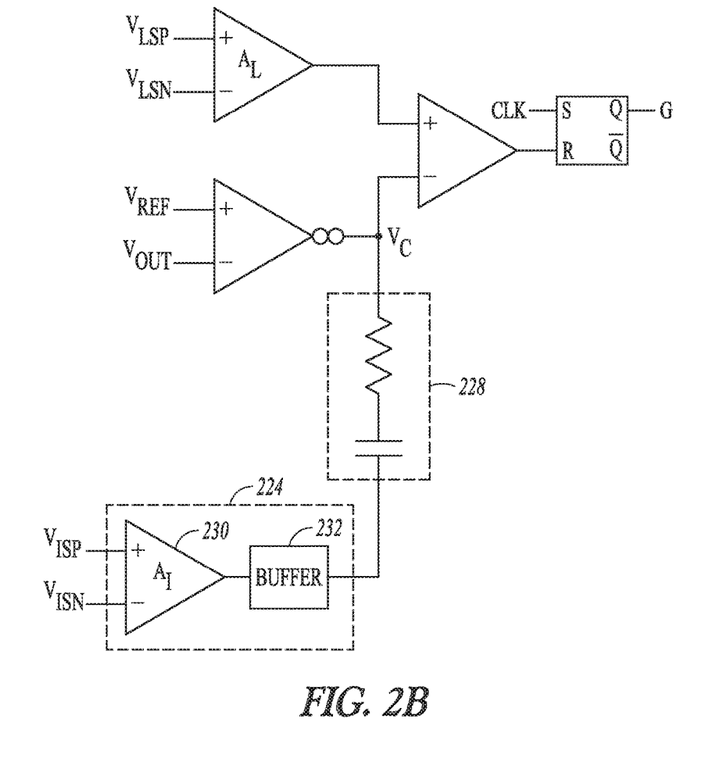

FIGS. 2A and 2B are circuit diagrams of a switching power converter circuit 200 in another aspect. As in the example of FIGS. 1A and 1B, the switching power converter circuit is a buck converter. In the example of FIG. 2A, the load current sensing circuit element 226 is a resistive circuit element (e.g., resistor $R_{IS}$). The voltage drop across the resistor is fed forward to the feedforward circuit 224. The feedforward circuit 224 includes a voltage amplifier 230 with gain $A_I$ and a buffer circuit 232. Ideally, the amount of current fed forward to the compensation circuit 228 is equal to the sensed load current $I_{LOAD}$. In the example implementation of FIG. 2B, the feedforward circuit 224 applies a feedforward current IF equal to $$I_{FF}=I_{LOAD} \cdot (R_{IS}/R_{SENSE}) \cdot (A_I/A_L). \quad (1)$$

Figure 3:
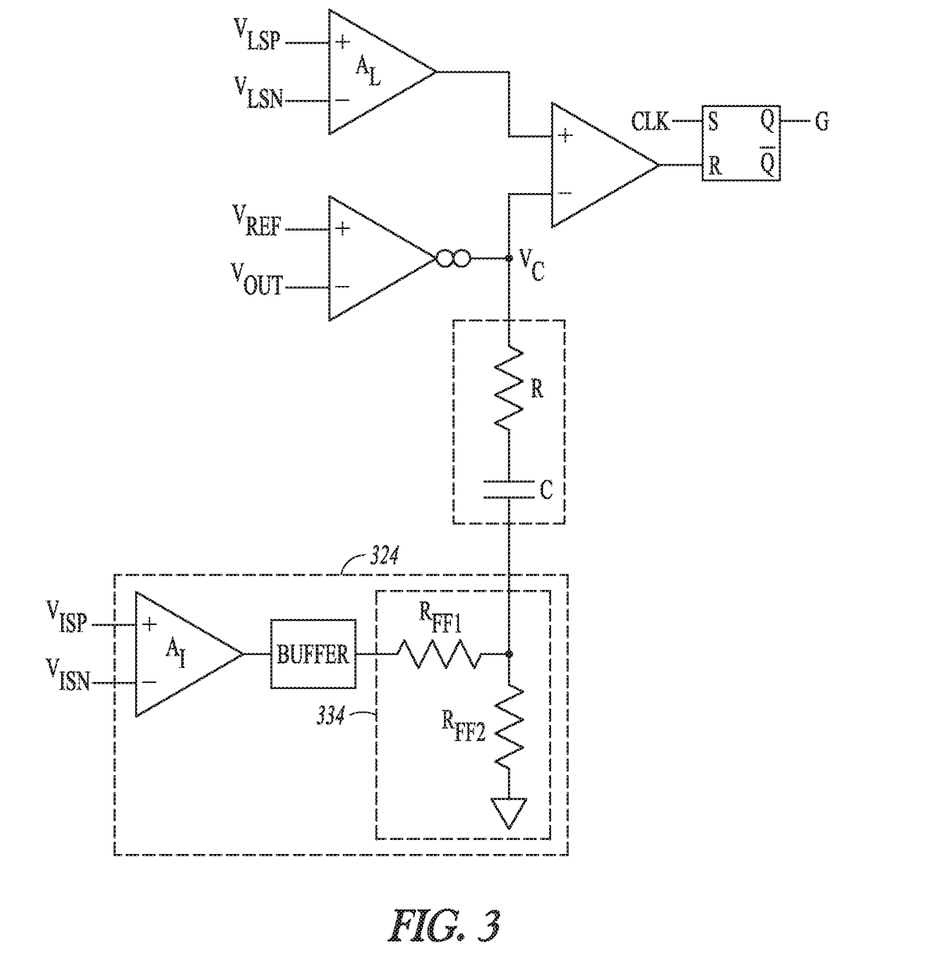
FIG. 3 is a circuit diagram of a feedforward circuit in another aspect.

FIG. 3 is a circuit diagram of a feedforward circuit 324 in another aspect. The circuit is the same as the example of FIG. 2B, except that it includes a tuning circuit 334 to provide additional adjustment to the amount of feedforward applied. In the example of FIG. 3, the tuning circuit 334 includes resistors $R_{FF1}$ and $R_{FF2}$ as a voltage divider. The feedforward current $I_{FF}$ is $$I_{FF}=I_{LOAD} \cdot (R_{IS}/R_{SENSE}) \cdot (A_I/A_L) \cdot [R_{FF1}/(R_{FF1}+R_{FF2})]. \quad (2)$$

The impedance of the feedforward circuit 324, $R_{FF1}$, and $R_{FF2}$ contribute to the stability of the control circuit. In the example of FIG. 2B, only the impedance of the feedforward circuit 224 is present. If the impedance of the feedforward circuit 224 is sufficiently less than the impedance of the compensation circuit 228, the stability of the control circuit is not degraded in the example of FIG. 2B.

Figure 4:
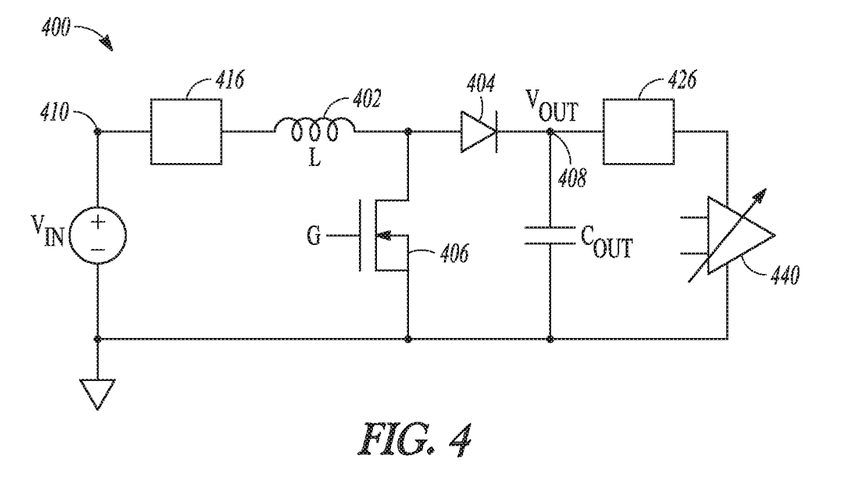
FIG. 4 is a circuit diagram of portions of a switching power converter circuit in another aspect.

FIG. 4 is a circuit diagram of portions of a switching power converter circuit 400 in another aspect. The switching power converter is a boost converter circuit. The load in the example of FIG. 4 is an amplifier 440 (e.g., a power amplifier) and the boost converter provides a regulated voltage to the amplifier. The supply connections to the amplifier 440 are the regulated circuit node and circuit ground. The boost converter regulates the voltage of the regulated circuit node to a voltage greater than the value of the input voltage Vin. The switch circuit 406 is arranged between the inductor 402 and the ground node, and the diode 404 is arranged between the inductor 402 and the regulated circuit node 408. The switching power converter circuit 400 includes an inductor current sensing circuit element 416 and a load current sensing circuit element 426. The control circuit (not shown) can include the feedforward circuit of either FIG. 2B or FIG. 3.

Ideally, the amount of current fed forward to the compensation circuit is equal to $$I_{FF}=\alpha \cdot I_{LOAD}, \quad (3)$$

where $\alpha$ is the ratio (Vout/Vin). In the implementation of the feedforward circuit 224 of FIG. 2B, the feedforward current $I_{FF}$ for the boost converter is as shown in equation (1). For the feedforward circuit 324 of FIG. 3, the feedforward current $I_{FF}$ is shown in equation (2).

Figure 5:
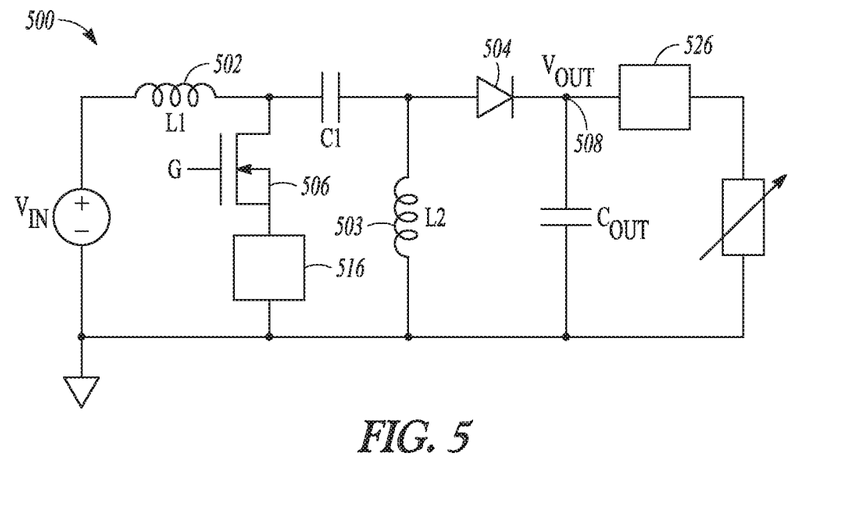
FIG. 5 is a circuit diagram of portions of a switching power converter circuit in another aspect.

FIG. 5 is a circuit diagram of portions of another switching power converter circuit 500 in another aspect. The switching power converter is a buck-boost converter circuit. The buck-boost converter regulates the voltage of the regulated circuit node to a voltage greater than or less than the value of the input voltage Vin and the output voltage may have negative polarity. The example in FIG. 5 is a single ended primary inductance converter (SEPIC). A first inductor 502 is arranged between the input circuit node and the switch circuit 506. A second inductor 503 is arranged between and the diode 504 and the circuit ground node. The switch circuit is arranged between the first inductor 502 and the circuit ground node. The diode 504 is arranged between the second inductor 503 and the regulated circuit node 508. The switching power converter circuit 500 includes inductor current sensing circuit element 516 and a load current sensing circuit element 526. The control circuit (not shown) can include the feedforward circuit of either FIG. 2B or FIG. 3.

Figure 6:
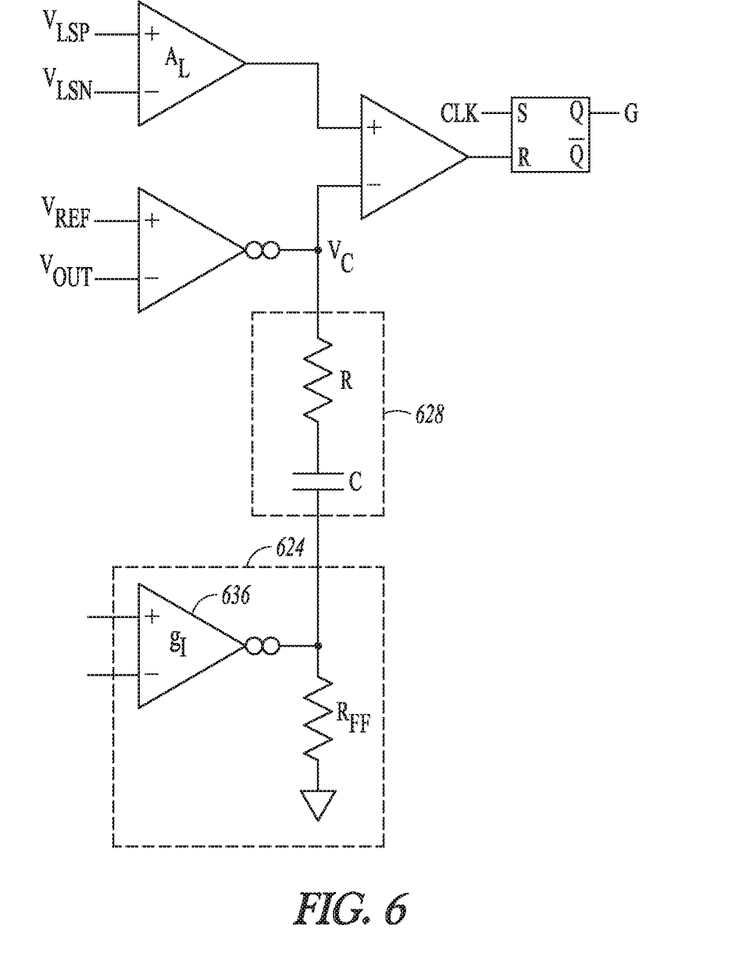
FIG. 6 is a circuit diagram of a feedforward circuit in another aspect.

FIG. 6 is a circuit diagram of a feedforward circuit 624 in another aspect. Instead of a voltage amplifier as in FIGS. 2 and 3, the feedforward circuit 624 of FIG. 6 includes a transconductance amplifier 636 having amplifier inputs coupled to the load current sensing circuit element (e.g., any of 126, 426, 526 of FIGS. 1, 4, and 5), and an amplifier output operatively coupled to the compensation circuit 628 to adjust a voltage at the compensation circuit node $V_C$. The feedforward circuit 624 can also include a feedforward resistor $R_{FF}$. Because the amplifier of the feedforward circuit of FIG. 6 is a current-type amplifier, the feedforward circuit 624 does not affect the impedance of the compensation circuit 628.

The feedforward current $I_{FF}$ applied to the compensation circuit 628 by the feedforward circuit 624 is $$I_{FF} = I_{LOAD} \cdot (R_{IS}/R_{SENSE}) \cdot (g_1/A_L) \cdot (R_{FF}), \qquad (4)$$

where $g_1$ is the transconductance of the transconductance amplifier 636.

It can be seen from equation (4) that the resistor $R_{FF}$ can be used to tune the amount of feedforward current provided to the compensation circuit 628. The feedforward circuit 624 gives more flexibility over the example of FIG. 3 because the feedforward amount can be either increased or decreased by adjusting RFF while the feedforward circuit 324 of FIG. 3 can only decrease the feedforward amount.

However, for a buck-boost converter, the input voltage may typically vary widely, and it may not be practical to tune the IFF by changing $R_{FF}$. In cases where the input Vin to a buck-boost converter varies widely, it may be more practical to fix the amount of feedforward current provided to the compensation circuit. It should be noted that the load current feedforward can be applied to other current-mode controlled converters, such as an inverting buck-boost converter, a Cúk converter, a four-switch buck-boost converter circuit, or a flyback converter if the amount of feedforward current is set appropriately.

Returning to FIG. 1A, in some aspects the load current sensing circuit element 126 is a magnetic current sensor. Some examples of a magnetic current sensor are a current transducer (or Hall Effect sensor) and an anisotropic magneto-Resistive (AMR) sensor. Whether a voltage type feedforward circuit or a current type feedforward circuit is used for a magnetic current sensor depends on whether the output of the sensor is a voltage or a current.

Figure 7:
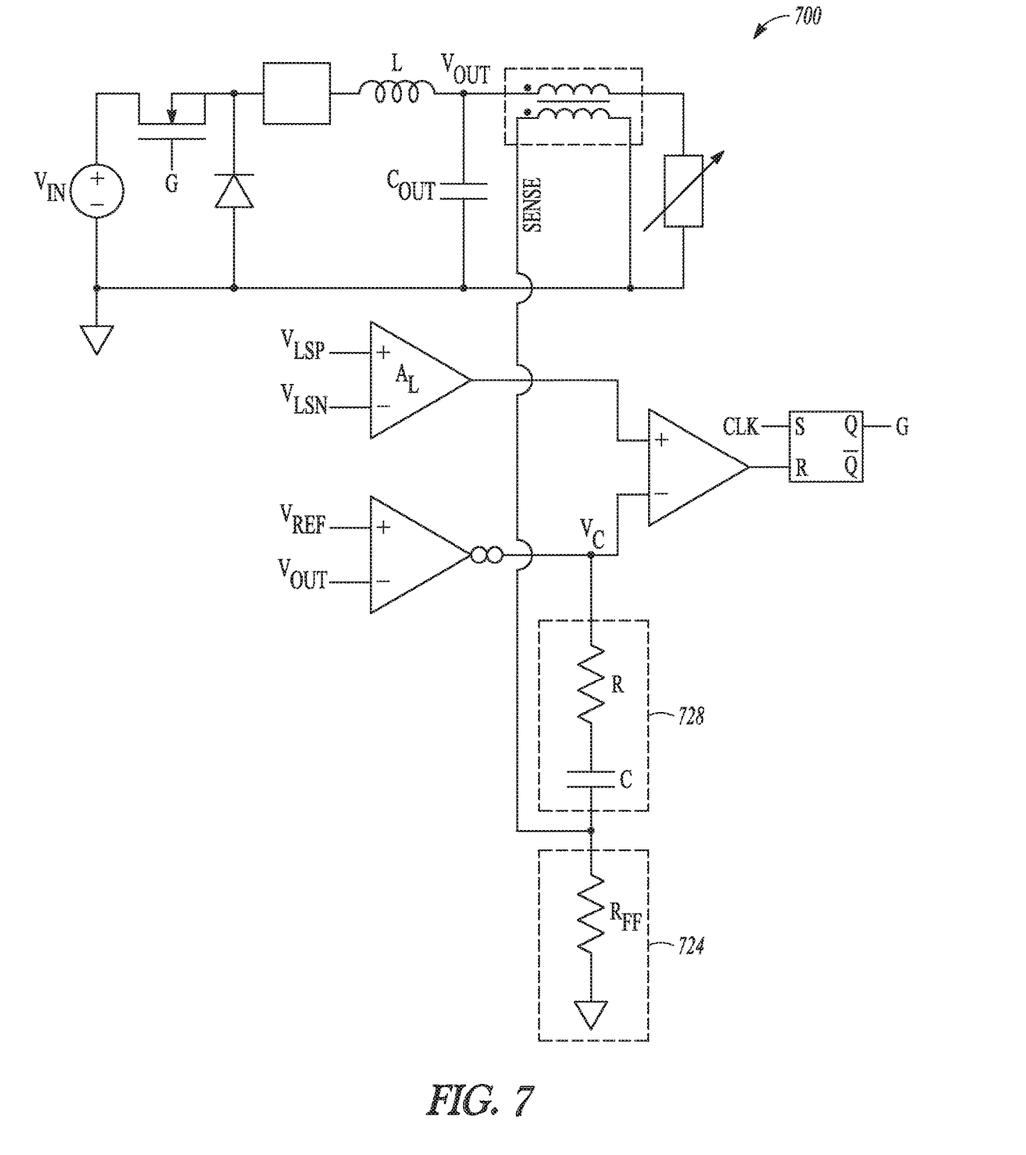
FIG. 7 is a circuit diagram of portions of a switching power converter circuit in another aspect.

FIG. 7 is a circuit diagram of portions of a switching power converter circuit 700 in another aspect. The circuit topology is a buck converter circuit as in FIG. 2A, but the load current sensing circuit element is a current transducer 738. Because the output of the current transducer in the example is a current source, the feedforward circuit 724 is a current type feedforward circuit that includes a feedforward resistor $R_{FF}$ coupled to the compensation circuit 728. The feedforward current $I_{FF}$ applied to the compensation circuit 628 by the feedforward circuit 724 is $$I_{FF} = I_{LOAD} \cdot (R_{FF}/R_{SENSE}) \cdot (1/A_L) \cdot (1/n), \qquad (5)$$

where n is the turns ratio (e.g., a 1:n turns ratio where n is the number of turns on the feedforward circuit side of the sensor and 1 is for the power converter circuit side).

Similar to the current transducer, for an AMR sensor either a voltage-type feedforward circuit or a current-type feedforward circuit can be selected depending on the output type of the AMR sensor. A discrete magnetic sensor product may include additional circuits (e.g., amplifiers, etc.) integrated with the magnetic sensor to convert the measured current to either a current source or a voltage source. The feedforward schemes described herein may be easily implemented even when the feedforward circuit is not integrated with the power converter circuit.

Figure 8:
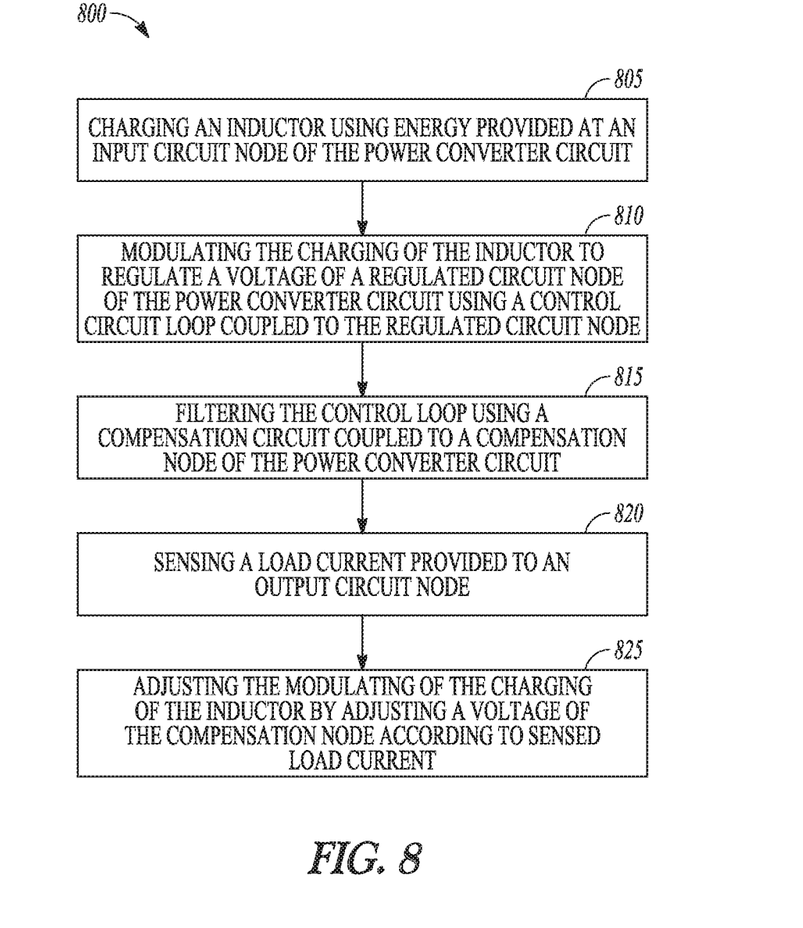
FIG. 8 is a flow diagram of an example of a method operating a switching power converter circuit in an aspect.

For completeness, FIG. 8 is a flow diagram of an example of a method 800 operating a switching power converter circuit, such as any of the switching power converter circuits described herein. At 805, an inductor is charged using energy provided at an input circuit node of the power converter circuit.

At 810, the charging of the inductor is modulated to regulate a voltage of a regulated circuit node of the power converter circuit using a control circuit loop coupled to the regulated circuit node. In some aspects, PWM is used to modulate the charging of the inductor. The pulse width of an activation signal applied to the switch is modulated according to the inductor current and according to a voltage proportional to the difference between the voltage of the regulated circuit node and a target voltage At 815, the control loop is filtered using a compensation circuit coupled to a compensation node of the power converter circuit. An example of the compensation circuit is a series connected resistor-capacitor (RC) circuit coupled to the output of an error amplifier used to monitor the voltage difference between the regulated circuit node and the target voltage.

At 820, the load current of the switching power converter is sensed. The load current is provided to an out circuit node of the switching power supply circuit that may be operatively coupled to a load circuit. At 825, the modulating of the charging of the inductor is adjusted by adjusting a voltage of the compensation circuit node according to sensed load current. Because the compensation circuit node is located at the output of the error amplifier, adjusting the voltage of the compensation node adjusts the charging of the inductor. Tuning of the voltage or current applied to the compensation node can be used to further adjust the voltage at the compensation node.

In some aspects, the switching power converted is a buck converter and the charging of the inductor is modulated to generate a regulated voltage at the regulated circuit node that is less than an input voltage at the input circuit node. The voltage of the compensation can be adjusted by applying a current proportional to the load current, as in any of equations (1) through (5) for example, to the compensation circuit node.

In some aspects, the switching power converter circuit is a boost converter and the charging of the inductor is modulated to generate a regulated voltage at the regulated circuit node that is greater than an input voltage at the input circuit node. The voltage of the compensation circuit node can be adjusted by applying a current proportional to the load current to the compensation circuit node.

In some aspects, the switching power converter circuit is a buck-boost converter and the charging of the inductor is modulated to generate a regulated voltage at the regulated circuit node that is greater than or less than an input voltage at the input circuit node. The voltage of the compensation circuit node can be adjusted by applying a current proportional to the load current to the compensation circuit node.

The several examples of systems, devices, and method described can be used to provide a regulated voltage as an electrical circuit supply for an electronic system. The regulated circuit supply is provided with improved transient response to large changes in load current.

Additional Description and Aspects

A first Aspect (Aspect 1) can include subject matter (such as a switching power converter circuit) comprising an inductor arranged to receive input energy from an input circuit node, a switch circuit coupled to the inductor, a load current sensing circuit element coupled to a regulated circuit node and an output circuit node, a compensation circuit coupled to a compensation circuit node, a control circuit coupled to the compensation circuit node and the switch circuit, the control circuit configured to modulate activation of the switch circuit to regulate a voltage at the regulated circuit node, and a feedforward circuit coupled to the load current sensing circuit element and the compensation circuit and configured to adjust modulation of the switch circuit according to sensed load current.

In Aspect 2, the subject matter of Aspect 1 optionally includes a feedforward circuit including a voltage amplifier having amplifier inputs coupled to the load current sensing circuit element and an amplifier output operatively coupled to the compensation circuit to adjust a voltage at the compensation circuit node.

In Aspect 3, the subject matter of one or both of Aspects 1 and 2 optionally includes a tuning circuit coupled to the compensation circuit and an output of the feedforward circuit, and configured to further adjust the voltage at the compensation circuit node.

In Aspect 4, the subject matter of one or any combination of Aspects 1-2 optionally includes a feedforward circuit including a transconductance amplifier having amplifier inputs coupled to the load current sensing circuit element and an amplifier output operatively coupled to the compensation circuit to adjust a voltage at the compensation circuit node.

In Aspect 5, the subject matter of one or any combination of Aspects 1-4 optionally includes an inductor current sensing circuit element coupled in series with the inductor. The control circuit optionally includes a comparator circuit, a voltage amplifier including inputs coupled to the inductor current sensing element and an output coupled to a first input of the comparator, and an error amplifier configured to produce a current proportional to a difference between a reference voltage and the voltage at the regulated circuit node. An output of the error amplifier is coupled to a second input of the comparator, and the output of the comparator is used to modulate the activation of the switch circuit.

In Aspect 6, the subject matter of one or any combination of Aspects 1-5 optionally includes a buck converter circuit as the switching power converter circuit. The feedforward circuit optionally applies a current proportional to the sensed load current to the compensation circuit.

In Aspect 7, the subject matter of one or any combination of Aspects 1-5 optionally includes a boost converter circuit as the switching power converter circuit. The feedforward circuit optionally applies, to the compensation circuit, a current proportional to the sensed load current multiplied by a ratio of a voltage at the regulated circuit node to a voltage at the input circuit node.

In Aspect 8, the subject matter of one or any combination of Aspects 1-5 optionally includes a buck-boost converter circuit as the switching power converter circuit. The feedforward circuit optionally applies, to the compensation circuit, a current proportional to the sensed load current multiplied by a ratio of a voltage at the regulated circuit node to a voltage at the input circuit node.

In Aspect 9, the subject matter of on or any combination of Aspects 1-8 optionally includes a load sensing circuit element that includes a resistive circuit element arranged between the regulated circuit node and the output circuit node.

In Aspect 10, the subject matter of one or any combination of Aspects 1-8 optionally includes a load sensing circuit element that is a magnetic current sensor.

Aspect 11 includes subject matter (such as a method comprising acts to control operation of a switching power converter circuit), or can optionally be combined with one or any combination of Aspects 1-10 to include such subject matter comprising charging an inductor using energy provided at an input circuit node of the power converter circuit, modulating the charging of the inductor to regulate a voltage of a regulated circuit node of the switching power converter circuit using a control circuit loop coupled to the regulated circuit node, filtering the control loop using a compensation circuit coupled to a compensation circuit node of the switching power converter circuit, sensing a load current provided to an output circuit node, and adjusting the modulating of the charging of the inductor by adjusting a voltage of the compensation circuit node according to sensed load current.

In Aspect 12, the subject matter of Aspect 11 optionally includes modulating the charging of the inductor to generate a regulated voltage at the regulated circuit node that is less than an input voltage at the input circuit node; and applying a current proportional to the load current to the compensation circuit.

In Aspect 13, the subject matter of Aspect 11 optionally includes modulating the charging of the inductor to generate a regulated voltage at the regulated circuit node that is greater than an input voltage at the input circuit node; and applying, to the compensation circuit, a current proportional to the load current multiplied by the ratio of the voltage at the regulated circuit node to the voltage at the input circuit node.

In Aspect 14, the subject matter of Aspect 11 optionally includes modulating the charging of the inductor to generate a regulated voltage at the regulated circuit node that can be greater than or less than an input voltage at the input circuit node; and applying, to the compensation circuit, a current proportional to the load current multiplied by the ratio of the voltage at the regulated circuit node to the voltage at the input circuit node and multiplied by an inverse of a duty cycle of the modulating the charging of the inductor.

In Aspect 15, the subject matter of one or any combination of Aspects 11-14 optionally includes tuning the voltage adjustment using a voltage divider circuit.

In Aspect 16, the subject matter of one or any combination of Aspects 11-14 optionally includes modulating the charging of the inductor using inductor current and using a voltage proportional to the difference between the voltage of the regulated circuit node and a reference voltage.

Aspect 17 includes subject matter (such as an electronic system), or can optionally be combined with one or any combination of Aspects 1-16 to include such subject matter, comprising a switching power converter circuit and a first amplifier circuit. The switch power converter circuit including an inductor arranged to receive input energy from an input circuit node, a switch circuit coupled to the inductor, a load current sensing circuit element coupled to a regulated circuit node and an output circuit node, a compensation circuit coupled to a compensation circuit node, a control circuit configured to modulate activation of the switch circuit to regulate a voltage at the regulated circuit node, and a feedforward circuit coupled to the load current sensing circuit element and the compensation circuit and configured to adjust modulation of the switch circuit according to sensed load current. The first amplifier circuit is operatively coupled to the regulated voltage node as a first amplifier supply connection and operatively coupled to circuit ground as a second amplifier supply connection.

In Aspect 18, the subject matter or Aspect 17 optionally includes a feedforward circuit including a second amplifier circuit. The second amplifier circuit is a voltage amplifier circuit having amplifier inputs coupled to the load current sensing circuit element and an amplifier output operatively coupled to the compensation circuit to adjust a voltage at the compensation circuit node.

In Aspect 19, the subject matter of one or both of Aspects 17 and 18 optionally includes a tuning circuit coupled to the compensation circuit and an output of the feedforward circuit, and configured to further adjust the voltage at the compensation circuit node.

In Aspect 20, the subject matter of one or both of Aspects 17 and 18 optionally includes a second amplifier circuit. The he second amplifier circuit is a transconductance amplifier circuit having amplifier inputs coupled to the load current sensing circuit element and an amplifier output operatively coupled to the compensation circuit to adjust a voltage at the compensation circuit node.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A switching power converter circuit comprising:
   an inductor arranged to receive input energy from an input circuit node;
   a switch circuit coupled to the inductor;
   a load current sensing circuit element coupled to a regulated circuit node;
   a feedforward circuit coupled to the load current sensing circuit element and configured to produce a feedforward signal representative of a load current;
   a compensation circuit configured to filter the feedforward signal to produce a filtered feedforward signal; and
   a control circuit coupled to the switch circuit and configured to modulate activation of the switch circuit to regulate a voltage at the regulated circuit node and to adjust modulation of the switch circuit according to the filtered feedforward signal.

2. The switching power converter circuit of claim 1, wherein the control circuit includes a compensation circuit node to receive the feedforward signal, and the feedforward circuit includes a voltage amplifier having amplifier inputs coupled to the load current sensing circuit element and an amplifier output operatively coupled to the compensation circuit to adjust a voltage at the compensation circuit node.

3. The switching power converter circuit of claim 2, including a tuning circuit coupled to the compensation circuit and an output of the feedforward circuit, and configured to further adjust the voltage at the compensation circuit node.

4. The switching power converter circuit of claim 1, wherein the control circuit includes a compensation circuit node to receive the feedforward signal, and the feedforward circuit includes a transconductance amplifier having amplifier inputs coupled to the load current sensing circuit element and an amplifier output operatively coupled to the compensation circuit to adjust a voltage at the compensation circuit node.

5. The switching power converter circuit of claim 1, including:
   an inductor current sensing circuit element coupled in series with the inductor;
   wherein the control circuit includes:
   a comparator circuit;
   a voltage amplifier including inputs coupled to the inductor current sensing element, and an output coupled to a first input of the comparator;
   an error amplifier configured to produce a current proportional to a difference between a reference voltage and the voltage at the regulated circuit node, wherein an output of the error amplifier is coupled to a second input of the comparator; and
wherein the output of the comparator is used to modulate the activation of the switch circuit.

6. The switching power converter circuit of claim 1, wherein the switching power converter circuit is a buck converter circuit and the feedforward circuit applies a current proportional to the sensed load current to the compensation circuit.

7. The switching power converter circuit of claim 1, wherein the switching power converter circuit is a boost converter circuit and the feedforward circuit applies, to the compensation circuit, a current proportional to the sensed load current multiplied by a ratio of a voltage at the regulated circuit node to a voltage at the input circuit node.

8. The switching power converter circuit of claim 1, wherein the switching power converter circuit is a single ended primary inductance converter (SEPIC) circuit and the feedforward circuit applies, to the compensation circuit, a current proportional to the sensed load current multiplied by a ratio of a voltage at the regulated circuit node to a voltage at the input circuit node.

9. The switching power converter circuit of claim 1, wherein the load sensing circuit element is a resistive circuit element arranged between the regulated circuit node and the output circuit node.

10. The switching power converter circuit of claim 1, wherein the load sensing circuit element is a magnetic current sensor.

11. A method of operating a switching power converter circuit, the method comprising:
charging an inductor using energy provided at an input circuit node of the power converter circuit;
modulating the charging of the inductor to regulate a voltage of a regulated circuit node of the switching power converter circuit using a control circuit loop coupled to the regulated circuit node, wherein the control circuit loop feeds forward a load current sensed at an output circuit node and the charging of the inductor is modulated using sensed inductor current and the fed forward sensed load current;
filtering the sensed load current using a compensation circuit coupled to a compensation circuit node of the switching power converter circuit; and
adjusting the modulating of the charging of the inductor by adjusting a voltage of the compensation circuit node according to sensed inductor current and the filtered sensed load current.

12. The method of claim 11,
wherein the modulating the charging of the inductor to regulate the voltage of the regulated circuit node includes modulating the charging of the inductor to generate a regulated voltage at the regulated circuit node that is less than an input voltage at the input circuit node; and
wherein the adjusting the voltage of the compensation circuit node includes applying a current proportional to the load current to the compensation circuit.

13. The method of claim 11,
wherein the modulating the charging of the inductor to regulate the voltage of the regulated circuit node includes modulating the charging of the inductor to generate a regulated voltage at the regulated circuit node that is greater than an input voltage at the input circuit node; and
wherein the adjusting the voltage of the compensation circuit node includes applying, to the compensation circuit, a current proportional to the load current multiplied by the ratio of the voltage at the regulated circuit node to the voltage at the input circuit node.

14. The method of claim 11,
wherein the modulating the charging of the inductor to regulate the voltage of the regulated circuit node includes modulating the charging of the inductor to generate a regulated voltage at the regulated circuit node that can be greater than or less than an input voltage at the input circuit node; and
wherein the adjusting the voltage of the compensation circuit node includes applying, to the compensation circuit, a current proportional to the load current multiplied by the ratio of the voltage at the regulated circuit node to the voltage at the input circuit node.

15. The method of claim 11, wherein the adjusting the voltage of the compensation node includes tuning the voltage adjustment using a voltage divider circuit.

16. The method of claim 11, wherein the modulating the charging of the inductor includes modulating the charging of the inductor using inductor current and using a voltage proportional to the difference between the voltage of the regulated circuit node and a reference voltage.

17. The switching power converter circuit of claim 1 including:
an inductor current sensing element;
wherein the control circuit is configured to adjust modulation of the switch circuit according to a sensed inductor current and the filtered feedforward signal; and
a first amplifier circuit operatively coupled to the regulated voltage node as a first amplifier supply connection and operatively coupled to circuit ground as a second amplifier supply connection.

18. The switching power converter circuit of claim 17, wherein the feedforward circuit includes a second amplifier circuit, wherein the second amplifier circuit is a voltage amplifier circuit having amplifier inputs coupled to the load current sensing circuit element and an amplifier output operatively coupled to the compensation circuit to adjust a voltage at a compensation circuit node of the control circuit.

19. The switching power converter circuit of claim 18, including a tuning circuit coupled to the compensation circuit and an output of the feedforward circuit, and configured to further adjust the voltage at the compensation circuit node.

20. The switching power converter circuit of claim 17, wherein the feedforward circuit includes a second amplifier circuit, wherein the second amplifier circuit is a transconductance amplifier circuit having amplifier inputs coupled to the load current sensing circuit element and an amplifier output operatively coupled to the compensation circuit to adjust a voltage at a compensation circuit node of the control circuit.

21. A power converter circuit comprising:
an inductor;
a switch circuit arranged to control charging of the inductor;
a feedforward circuit configured to produce a feedforward signal representative of a load current at a regulated circuit node of the power converter circuit;
a compensation circuit configured to filter the feedforward signal to produce a filtered feedforward signal; and
a control circuit including a compensation circuit node to receive the filtered feedforward signal, the control circuit configured to modulate activation of the switch circuit to regulate a voltage at the regulated circuit node and to adjust modulation of the switch circuit according to the filtered feedforward signal.

22. The power converter circuit of claim 21, including:
a load current sensing circuit element coupled to the regulated circuit node;
wherein the feedforward circuit includes a voltage amplifier having amplifier inputs coupled to the load current sensing circuit element and an amplifier output operatively coupled to the compensation circuit to adjust a voltage at the compensation circuit node.

23. The power converter circuit of claim 21, including:
a load current sensing circuit element coupled to the regulated circuit node;
wherein the feedforward circuit includes a transconductance amplifier having amplifier inputs coupled to the load current sensing circuit element and an amplifier output operatively coupled to the compensation circuit to adjust a voltage at the compensation circuit node.

24. The power converter circuit of claim 21, including a current transducer coupled to the regulated circuit node, the feedforward circuit, and the compensation circuit.

* * * * *